United States Patent [19]

Someshwar

[11] 4,370,625
[45] Jan. 25, 1983

[54] INTEGRATED CIRCUIT HAVING ELEMENTS FOR SELECTIVELY FORMING AN RC OR A CRYSTAL OSCILLATOR

[75] Inventor: Ashok H. Someshwar, Austin, Tex.

[73] Assignee: Motorola, Inc., Schaumburg, Ill.

[21] Appl. No.: 223,183

[22] Filed: Jan. 7, 1981

[51] Int. Cl.³ .......................... H03B 5/20; H03B 5/32
[52] U.S. Cl. ........................................ 331/49; 331/59;
  331/108 D; 331/111; 331/116 R; 331/DIG. 3
[58] Field of Search ........... 331/49, 59, 108 C, 108 D,
  331/111, 116 R, 173, 62

[56] References Cited

U.S. PATENT DOCUMENTS

| | | | |
|---|---|---|---|
| 2,992,397 | 7/1961 | Roberts | 331/59 X |
| 3,916,345 | 10/1975 | Eberlein et al. | 331/108 D X |
| 4,083,020 | 4/1978 | Goldberg | 331/108 C X |

*Primary Examiner*—Siegfried H. Grimm
*Assistant Examiner*—Tim A. Wiens
*Attorney, Agent, or Firm*—Anthony J. Sarli, Jr.; Jeffrey Van Myers; James L. Clingan, Jr.

[57] ABSTRACT

In a microcomputer integrated circuit the option of selecting between an RC oscillator or a crystal oscillator for generating the clock for the microprocessor is made available. By making the selection during the manufacturing process, external pin outs and chip area are minimized.

6 Claims, 4 Drawing Figures

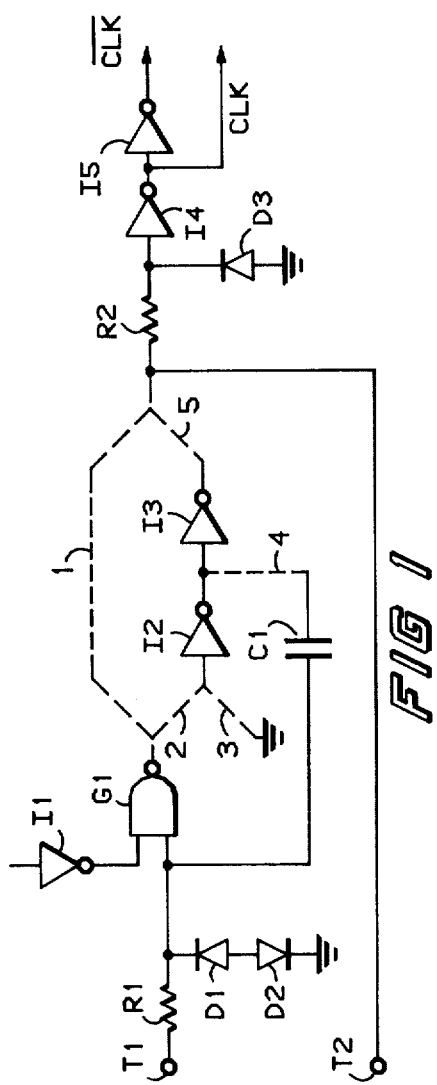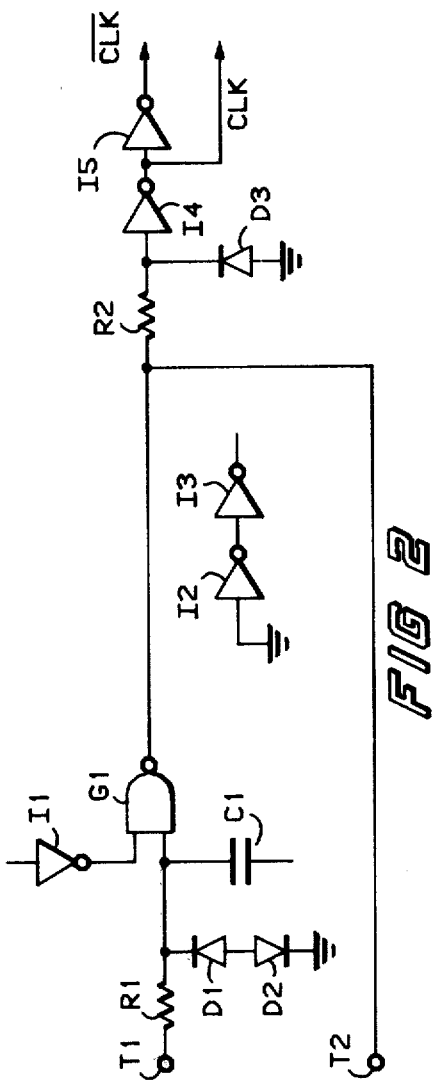

INTEGRATED CIRCUIT HAVING ELEMENTS FOR SELECTIVELY FORMING AN RC OR A CRYSTAL OSCILLATOR

BACKGROUND ART

This invention relates to integrated circuit devices and, more particularly, to microprocessors.

The desires to save as much circuit board space as possible and to integrate as much of a circuit function on a single chip as possible have resulted in placing some microprocessor-associated functions on the integrated circuit with the microprocessor. One of these MPU-associated functions is the oscillator for generating the clock of the microprocessor. Two types of MPU clock oscillators are in common use for differing applications, the RC oscillator which is relatively less expensive to implement and the crystal oscillator which is inherently more stable. Consequently, it is desirable to provide the option for choosing either type of oscillator on the integrated circuit.

Typically, the frequency of a crystal oscillator is chosen by the selection of the crystal whereas the frequency of an RC oscillator is chosen by the selection of the resistor of the RC pair. If both options are to be provided on an MPU chip, this implies that two external pins must be provided for the RC oscillator and two external pins must be provided for the crystal oscillator. Whereas it is desirable to offer both oscillator options on the chip, it is necessary to only provide one for a given customer's requirement. Consequently, if both options are provided, the customer is provided with two pins that are unnecessary for his application. If only the two external pins that the customer requires are provided, an advantage in providing a smaller package results. When the integrated circuit has an on-board read only memory control store (ROM) which will be programmed for a particular customer for a given application, it is known in advance which oscillator circuit is desired. This fact affords the opportunity to alter the integrated circuit during the manufacture thereof so that only the two external pins required for the oscillator of the type required by the customer are provided to that customer. Although providing both oscillator options facilitates the manufacturing advantage of only making one type of integrated circuit, it has the disadvantage of requiring more chip space than would be required if only one oscillator were available. Accordingly, it is an object of the instant invention to provide an integrated circuit with plural oscillator types thereon, selectable at the time of manufacture, utilizing a minimum of chip area, and providing a minimum of external pins.

BRIEF SUMMARY OF INVENTION

The invention provides circuit elements sufficient to provide an RC oscillator as well as a crystal oscillator.

At a particular manufacturing stage, the selection is made on the chip as to which of the two circuits will be made available to the customer via two external pins. The oscillator circuits are chosen so that at least some of the circuit elements are useable in both the crystal oscillator and the RC oscillator. This has the beneficial effect of reducing the total chip space required for providing both options.

One such circuit element common to both oscillators is an inverter function. The minimum gain requirement of the inverter function is lower for proper operation of the RC oscillator than for proper operation of the crystal oscillator. Consequently, the gain of this common circuit element is reduced for the RC circuit and thereby saves power.

A single photo mask used in the processing of the chip selects between the RC oscillator and the crystal oscillator. This is the same mask which programs a ROM. Since a ROM must be uniquely programmed for a given operation, the same mask that will be unique for a particular customer can also be used for the selection of the oscillator. Consequently, there is no additional mask cost or processing step for the selection between the oscillators when an on-board ROM is also provided.

BRIEF DESCRIPTION OF DRAWINGS

FIG. 1 shows the circuit elements required for both RC and crystal oscillator circuits in an alternative connection configuration.

FIG. 2 shows the circuit elements connected into a crystal oscillator circuit option.

DETAILED DESCRIPTION OF INVENTION

A preferred embodiment of the invention utilizes a complementary MOS (CMOS) microprocessor or microcomputer with an on-board ROM and having an option of selecting between an RC oscillator or a crystal oscillator for generating a clock for the operation of the microprocessor.

FIG. 1 shows circuit elements which are provided and are sufficient for implementation of either the RC oscillator or the crystal oscillator. Terminals T1 and T2 are provided for connection to external pins for connecting therebetween either a crystal and resistor or a resistor, in order to complete an oscillator circuit which provides a clock for operation of the microprocessor. Solid lines show the connections which are common to both the RC oscillator and the crystal oscillator. Dotted lines depict the lines which are optionally connected for completion of the RC oscillator or the crystal oscillator. Dotted lines 1 and 3 are connected for completion of the crystal oscillator whereas dotted lines 2, 4, and 5 are connected for completion of the RC oscillator.

From terminal T1 resistor R1 is coupled to a first input of NAND gate G1. An output of NAND gate G1 is preferably coupled to either an input of inverter I2 for the RC oscillator or to terminal T2 for the crystal oscillator. A cathode of diode D1 is coupled to a connection between resistor R1 and the NAND gate G1. An anode of diode D1 is coupled to an anode of diode D2. A cathode of D2 is coupled to ground or some other negative supply. A first end of capacitor C1 is coupled to the cathode of diode D1 with a second end preferably coupled to either an output of inverter I2 for the RC oscillator or not connected for the crystal oscillator. An output of inverter I2 is coupled to an input of inverter I3. An output of inverter I3 is preferably coupled to either terminal T2 for the RC oscillator or not connected for the crystal oscillator. A first end of resistor R2 is coupled to terminal T2 with a second end coupled to an input of inverter/buffer I4. An output of inverter/buffer I4 provides the clock and is coupled to an input of inverter/buffer I5. An output of inverter/buffer I5 provides an inverter clock. An input of inverter I1 is coupled to a disable signal. An output of inverter I1 is coupled to a second input of NAND gate G1.

Figure 3:
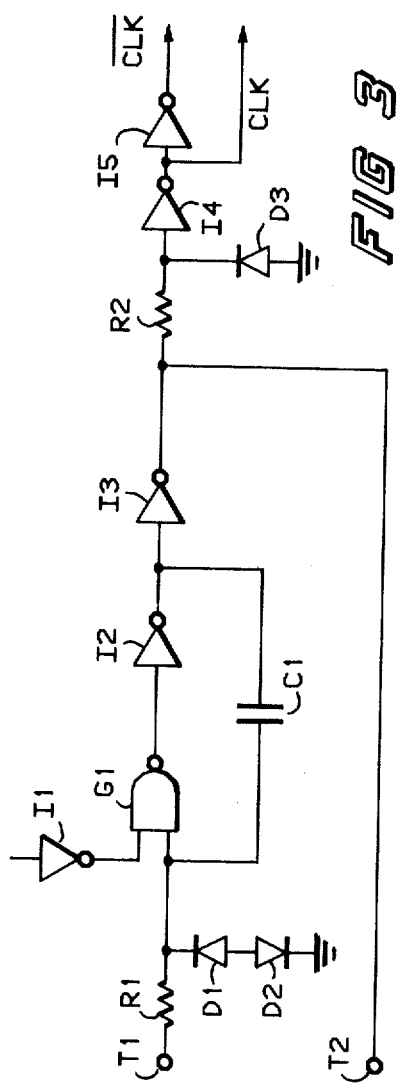
FIG. 3 shows the circuit elements connected into an RC oscillator option.

FIG. 2 shows the connection of the elements of FIG. 1 to form a crystal oscillator. FIG. 3 shows the connection of the elements of FIG. 1 to form an RC oscillator. In FIG. 2 a crystal and resistor are connected in parallel across terminals T1 and T2 for completion of the crystal oscillator. It may be desirable to add capacitance across terminals T1 and T2 for fine tuning. In FIG. 3, a resistor is connected across terminals T1 and T2 for completion of the RC oscillator. The frequency is dependent upon the resistance selected. Operation of both the RC oscillator (FIG. 2) and the crystal oscillator (FIG. 3) will be understood by one of ordinary skill in the art.

Note that in implementing the crystal oscillator (FIG. 2), the two inverters I2 and I3 of FIG. 1 are not necessary for its operation and are, therefore, not connected as part of the circuit. The input of the first of these two inverters I2 is grounded for stability. Only one end of capacitor C1 is connected and, consequently, C1 is not a functioning part of the circuit. The connection for the RC oscillator (FIG. 3) includes all of the circuit elements. The common labeling of the circuit elements in FIGS. 1-3 does indicate that the elements are the same in the three figures.

Figure 4:
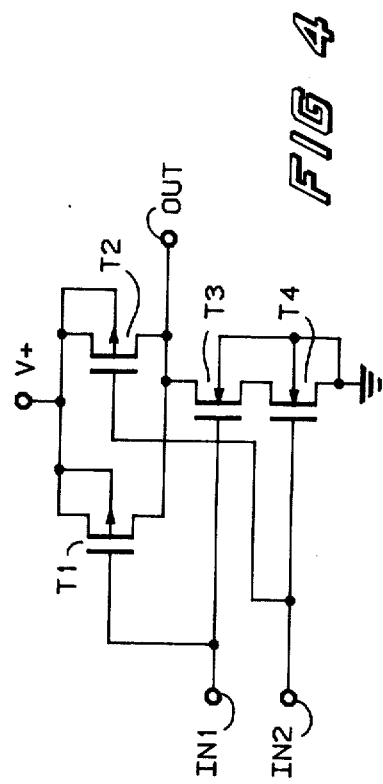
FIG. 4 shows a CMOS NAND gate.

The NAND gate G1 which functions as an inverter in both oscillator circuits preferably has two different gain characteristics dependent upon whether it is functioning in the RC oscillator or the crystal oscillator. The crystal circuit requires more gain from this inverter than does the RC circuit. A typical CMOS NAND gate that is used for this inverter is shown in FIG. 4. Transistors T1 and T2 are enhancement mode P-channel devices whereas transistors T3 and T4 are enhancement mode N-channel devices. A channel length for all the transistors may be 5 microns but a channel width is determined during a diffusion process step be defining active region areas via a single photo mask. The gain is increased or decreased by increasing or decreasing the channel width. For the crystal oscillator, the channel width for the P-channel devices may be 220 microns and for the N-channel devices, 100 microns. For the RC oscillator, the channel width for the P-channel devices may be 20 microns and for the N-channel devices, 10 microns. The size of the transistors for the NAND gate G1 for the RC circuit is reduced for the purpose of minimizing power consumption. The reason a NAND gate is used as an inverter in the operation of the oscillator is so that it can also be used as the means for disabling the oscillator when a disabling signal is received via inverter I1.

That the NAND gate G1 is used in both oscillators is one feature of the invention. There are other circuit elements which are common to both oscillators which are features of the invention. They are an input protection circuit of resistor R1, diode D1 and diode D2, an output limiting circuit of resistor R2 and diode D3, an output inverter/buffer 14, a clock inverter/buffer I5, and a disabling coupler of inverter I1. The commonality of these circuit elements has the beneficial effect of reducing the required chip area for providing the oscillator function.

Another aspect of the preferred embodiment is that only one photo mask need be unique for choosing between the RC and crystal oscillators and for sizing the NAND gate. That this can be achieved at the diffusion process step provides an additional advantage because the photo mask for this step is the one that is used for programming a ROM. In this case where a ROM is to be programmed, a unique photo mask must be provided for a given program. For this given program it will be known whether the RC or crystal oscillator is desired. Consequently, because the choice between oscillators is implemented via the same photo mask that implements the given program, no additional masks are required thereby saving costs.

It is to be noted that the diffusion process step referenced herein is the CMOS process step of defining the surface dimensions of active regions. The active regions are regions in the substrate where the active elements, primarily transistors, are located. The transistors can be P-channel or N-channel IGFETS, but the determination is made at other process steps. The transistors of the NAND gate are consequently conveniently preferably sized at the diffusion process step. Because the ROM is programmed by the presence or absence of a transistor on a given matrix point the program is implemented at the diffusion process step by providing the presence or absence of an active region at the matrix point.

That electrical connections can be preferably made or not made at the diffusion process step is made possible by the ability to connect a surface polysilicon or metal line directly to a source or drain of an IGFET or some other diffused region in a substrate. Masks other than the mask for the diffusion step are prepared as if all optional connections are to be made, the optional connections being from a surface conductor to a specified diffused region. The option to not make the connection is exercised by size limiting specified active regions so that the surface conductor line is not connected to the specified diffused region for which it was intended and thereby making the line an open circuit.

While the invention has been described in the context of a preferred embodiment, it will be apparent to those skilled in the art that the invention may be modified in numerous ways and may assume many embodiments other than that specifically set out and described above. Accordingly, the appended claims are intended to cover all modifications of the invention which fall within the true spirit and scope of the invention.

I claim:

1. An integrated circuit having a plurality of circuit elements comprising:

a first terminal and a second terminal;

a first inverter having an input coupled to the first terminal, a second inverter, and a third inverter; and a capacitor;

wherein the circuit elements are interconnected by one of a first or a second process step; and wherein an RC oscillator is provided in response to a resistor being coupled between the first and second terminals, and in response to an output of the first inverter being coupled to an input of the second inverter, an output of the second inverter being coupled to an input of the third inverter, an output of the third inverter being coupled to the second terminal, and the capacitor coupled between the input of the first inverter and the output of the second inverter by the first process step; or wherein a crystal oscillator is provided in response to a crystal being coupled between the first and second terminals, and in response to the output of the first inverter being coupled to the second terminal by the second process step.

2. An integrated circuit for providing one of an RC oscillator circuit or a crystal oscillator circuit, comprising a gain stage having a plurality of active elements coupled to a first terminal wherein at least one of said active elements is common to both the RC oscillator circuit and the crystal oscillator circuit; and a feedback path coupled from the gain stage to a second terminal; wherein the first and the second terminals are for receiving one of a resistance or crystal to form either an RC or a crystal oscillator, respectively.

3. The integrated circuit of claim 2 wherein an inverter having gain selectable by a process step is common to both the RC and crystal oscillator circuits.

4. The integrated circuit of claim 2 wherein one of the RC or crystal oscillator circuits is chosen by a single process step.

5. The integrated circuit of claim 4 wherein said single process step is a step which defines a field oxide.

6. The integrated circuit of claim 4 wherein said single process step is a step which defines a program of a ROM.

* * * * *